United States Patent
Heitzmann et al.

(10) Patent No.: US 9,553,266 B2
(45) Date of Patent: Jan. 24, 2017

(54) PROCESS OF STRUCTURING AN ACTIVE ORGANIC LAYER DEPOSITED ON A SUBSTRATE

(71) Applicant: Commissariat A L'Energie Atomique Et Aux Energies Alternatives, Paris (FR)

(72) Inventors: Marie Heitzmann, Sinard (FR); Simon Charlot, Grenoble (FR)

(73) Assignee: Commissariat A L'Energie Atomique Et Aux Energies Alternatives, Paris (FR)

( * ) Notice: Subject to any disclaimer, the term of this patent is extended or adjusted under 35 U.S.C. 154(b) by 0 days.

(21) Appl. No.: 14/220,261

(22) Filed: Mar. 20, 2014

(65) Prior Publication Data

US 2014/0235013 A1 Aug. 21, 2014

Related U.S. Application Data

(63) Continuation of application No. PCT/FR2012/051649, filed on Jul. 12, 2012.

(30) Foreign Application Priority Data

Sep. 30, 2011 (FR) ..................... 11 58776

(51) Int. Cl.
 *H01L 51/00* (2006.01)
(52) U.S. Cl.
 CPC ....... *H01L 51/0002* (2013.01); *H01L 51/0016* (2013.01)
(58) Field of Classification Search
 None
 See application file for complete search history.

(56) References Cited

U.S. PATENT DOCUMENTS

| | | | |
|---|---|---|---|
| 4,253,888 A | 3/1981 | Kikuchi | |
| 6,013,538 A | 1/2000 | Burrows et al. | |
| 2005/0048414 A1 | 3/2005 | Harnack et al. | |
| 2007/0275502 A1* | 11/2007 | George et al. | 438/106 |
| 2008/0278068 A1* | 11/2008 | Huang et al. | 313/504 |
| 2011/0012097 A1 | 1/2011 | Yoneya | |

FOREIGN PATENT DOCUMENTS

| | | |
|---|---|---|
| WO | 2004/036663 A2 | 4/2004 |
| WO | 2009/143357 A2 | 11/2009 |
| WO | 2011/004198 A2 | 1/2011 |

OTHER PUBLICATIONS

International Search Report dated Oct. 16, 2012.

* cited by examiner

*Primary Examiner* — Julio J Maldonado
*Assistant Examiner* — Stanetta Isaac
(74) *Attorney, Agent, or Firm* — Burr & Brown, PLLC

(57) ABSTRACT

A method of structuring an active organic layer deposited on a substrate, including depositing a sacrificial layer on the substrate by photolithography, the sacrificial layer being made of at least one resist, creating at least one pattern inside of the sacrificial layer, depositing an active organic layer on the sacrificial layer and in the pattern, depositing a protective layer made of organic polymer on the active layer and in the pattern of the resist sacrificial layer, removing the sacrificial layer by projection of a solvent on the resin forming the layer, and removing the protective layer by dissolving the polymer forming it in a solvent.

11 Claims, 3 Drawing Sheets

PROCESS OF STRUCTURING AN ACTIVE ORGANIC LAYER DEPOSITED ON A SUBSTRATE

BACKGROUND OF THE INVENTION

1. Field of the Invention

The present invention relates to organic electronic components, and more particularly to issues due to the localizing of an active organic layer on forming of electronic components or the like. The invention more specifically relates to a method of structuring an active organic layer deposited on a substrate, and to the step of chemically etching the active layer, on manufacturing of an organic diode.

2. Description of Related Art

In the field of microelectronics, that is, of micrometric-scale electronic components, the electronic components have been initially developed from inorganic materials such as silicon or gallium arsenide (GaAs), particularly to form the active layer of the components, the latter being formed of a stack of such inorganic layers.

Such inorganic electronic components have the disadvantage of being expensive to manufacture and of being rigid, and accordingly of being fragile and impossible to use for certain applications.

Thus, the active layers of electronic components are now more and more frequently made of organic materials, such as polymers, for example, which have the advantage of being easy to manufacture at a large scale, of having a good mechanical and/or thermal behavior, of having a flexible structure and of being easy to recycle. Further, polymers being soluble in a solvent, the latter may advantageously be deposited in a layer by low-cost and easy-to-implement deposition methods such as, particularly, spin coating, inkjet deposition, or silk-screening deposition.

This is why displays based on OLED or Organic Light-Emitting Diodes or based on OTFT or Organic Thin-Film Transistors can now currently be encountered. Such electronic components are usually formed of a stack of organic and/or inorganic layers where the active layer is made of an organic material.

However, such a stack of organic and/or inorganic layers raises a number of issues, particularly on forming of organic diodes, which requires a highly-homogeneous deposition of an organic active layer, the stacking of the layers of an organic diode usually being as follows: a substrate made of glass, plastic, silicon, etc., a local conductive layer made of indium-tin oxide or ITO, metal, a conductive polymer, etc., a injector layer made of poly(3,4-ethylenedioxythiophene) poly(styrenesulfonate) or PEDOT:PSS, for example, an active layer made of a mixture of n- and p-type semiconductor called bulk heterojunction, and a local conductive layer made of metal or a conductive polymer, for example.

Indeed, in the manufacturing of an organic diode, the deposition of the active organic layer is the critical step. Such an organic layer should be very homogeneous and with no defect capable of causing an electric leakage between the two conductive layers of the diode. The active organic layer is usually deposited by a spin coating method, which provides film-forming deposits. However, spin coating does not enable to structure the active organic layer. To structure the active layer, after its deposition on the substrate, several techniques are used, including subtractive etching, also called direct etching, and lift-off.

Subtractive etching, for example illustrated in FIG. 1, comprises, after having deposited an active layer 1 on a substrate 2 at a step 1a, depositing during a step 1b a polymer 3, and this locally on active layer 1 by any appropriate means such as inkjet or silk-screening, for example, the polymer 3 for example being a fluoropolymer sold under trade name CYTOP®. At a step 1c, the portions of active layer 1 which are not covered with the polymer are then chemically etched by application of a solvent such as xylene, chlorobenzene, tetraline, toluene, etc., after which the polymer is stripped, that is, dissolved with a solvent which does not etch active layer 1, such as perfluorotributylamine (FC43) for example.

Such a subtractive etching is particularly described in document WO 2011/004198.

Subtractive etching has the disadvantage of deteriorating the active layer, as can be seen in FIG. 2, which is an optical microscope view of the surface of the active layer after a subtractive etching. Indeed, the chemical action of the etch solvent causes an overetching of the active layer on the pattern edges.

The second structuring technique, called lift-off, comprises, referring to FIG. 3, depositing a sacrificial resist layer 4 on a substrate 2 at a step 1a, and then structuring the sacrificial layer 4 to create a pattern 5 in the sacrificial layer 4 by chemical etching, for example, at a step 1b. At step 1c, an active organic layer 1 is deposited on sacrificial layer 4 and at the bottom of pattern 5, after which, at a last step 1d, sacrificial layer 4 is dissolved in a solvent bath, generally acetone, to only leave the pattern of active layer 1 on substrate 2.

This type of "lift-off" structuring method is especially described in documents US 2005/0048414 and US 2011/0012097.

The lift-off technique also has the disadvantage of deteriorating active layer 1. Indeed, active layer 1 is damaged by the action of the acetone bath during the dissolution of the sacrificial layer, the acetone bath lasting for approximately 20 minutes. Such an acetone bath weakens active layer 1, resulting in poorly-defined pattern edges and pittings, as can be seen in FIG. 4A and respectively 4B.

SUMMARY OF THE INVENTION

One of the aims of the invention thus is to overcome such disadvantages by providing a method of structuring an organic active layer deposited on a substrate, easy to implement and of low cost, and providing defect-free active layer patterns.

For this purpose, and according to the invention, a method of structuring an active organic layer deposited on a substrate is provided, comprising:

depositing by photolithography a sacrificial layer made of at least one resist on the substrate, creating at least one opening inside of the sacrificial layer defining a pattern, but for one pattern in the sacrificial resist layer, depositing an active organic layer on the sacrificial resist layer, depositing a protective layer made of organic polymer on the active layer and in the pattern of the sacrificial resist layer, removing the sacrificial resist layer by projection of a solvent on the resin, and removing the organic polymer protective layer by dissolution of polymer in a solvent.

It should be understood that, conversely to prior art methods, the protective polymer layer deposited in the pattern of the sacrificial resist layer covers the active layer deposited in pattern and protects it on removal of the resist by projection of a solvent. Further, the mechanical effect of the solvent projection enables to decrease the duration of the solvent contact with the different component layers, the contact time being shorter than 1 minute, conversely to prior art methods where the solvent remains in contact with the layers for a duration of approximately 20 minutes, and to avoid the redeposition of particles on the active layer.

The step of creating patterns on the resist comprises at least the steps of:
annealing the sacrificial resist layer at a temperature in the range from 100 to 130° C. for from 1 to 5 minutes,
exposing the annealed sacrificial resist layer to light through a mask comprising at least one pattern, and
developing the pattern by sprinkling of a developer on sacrificial resist layer.

The resist is made of a negative resin, for which ultraviolet radiation induces a polymerization of the exposed areas and/or of a positive resin, for which the ultraviolet radiation induces a chemical transformation of the macromolecules of resin, and/or of a reversible resin, which has the property of changing polarity in a reversion anneal step.

Further, the step of removing the sacrificial resist layer comprises projecting a solvent on sacrificial resist layer for a period in the range from 5 to 60 seconds, solvent being for example made of acetone.

The step of depositing an active organic layer comprises depositing by spin coating a mixture of organic p- and n-type semiconductor molecules or polymers.

The mixture of organic p- and n-type semiconductor molecules or polymers may for example be made of a mixture of poly(3-hexyl-thiophene) (P3HT) and of 1-(3-methoxy-carbonyl)propyl-1-phenyl-(6,6)C-61 (PCBM) in o-dichlorobenzene, or of a mixture of poly(3-octylthiophene-2,5-diyl)(P3OT) and (6,6)-phenyl $C_{71}$ butyric acid ester ($PC_{71}BM$).

The step of depositing an organic polymer protective layer in the pattern of the sacrificial resist layer comprises at least the steps of:
silk-screening deposition of at least one thermocrosslinkable perfluorinated aliphatic polymer on the active layer and in the pattern defined in the sacrificial resist layer, and
annealing at a temperature in the range of 40 to 80° C. for 2 to 10 minutes.

BRIEF DESCRIPTION OF THE DRAWINGS

The foregoing and other features and advantages will be discussed in detail in the following non-limiting description of an alternative execution of the method of structuring of an active layer deposited on a substrate according to the invention, in connection with the accompanying drawings, among which.

DETAILED DESCRIPTION OF THE INVENTION

Figure 1:
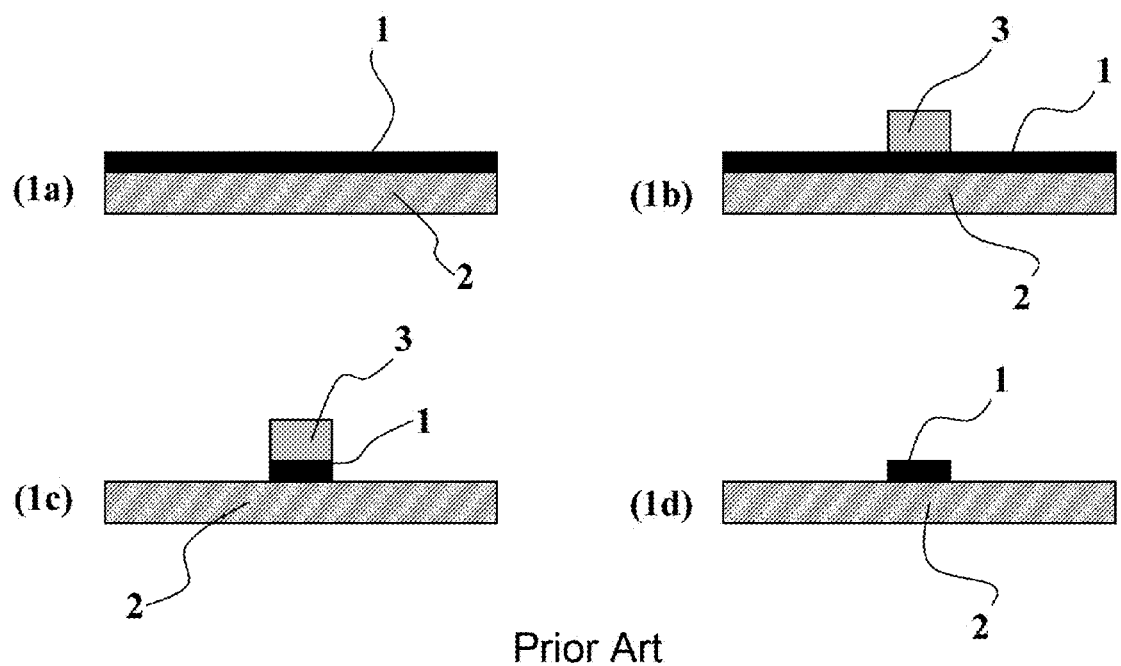
FIG. 1 is a simplified cross-section view of the different steps of the method of structuring an active layer of an electronic component by subtractive etching of prior art.
Figure 2:
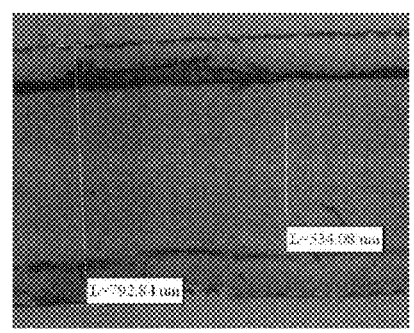
FIG. 2 is an optical microscope view of the defects of the surface of the active layer of an electronic component obtained with a structuring of the active layer by subtractive etching of prior art.
Figure 3:
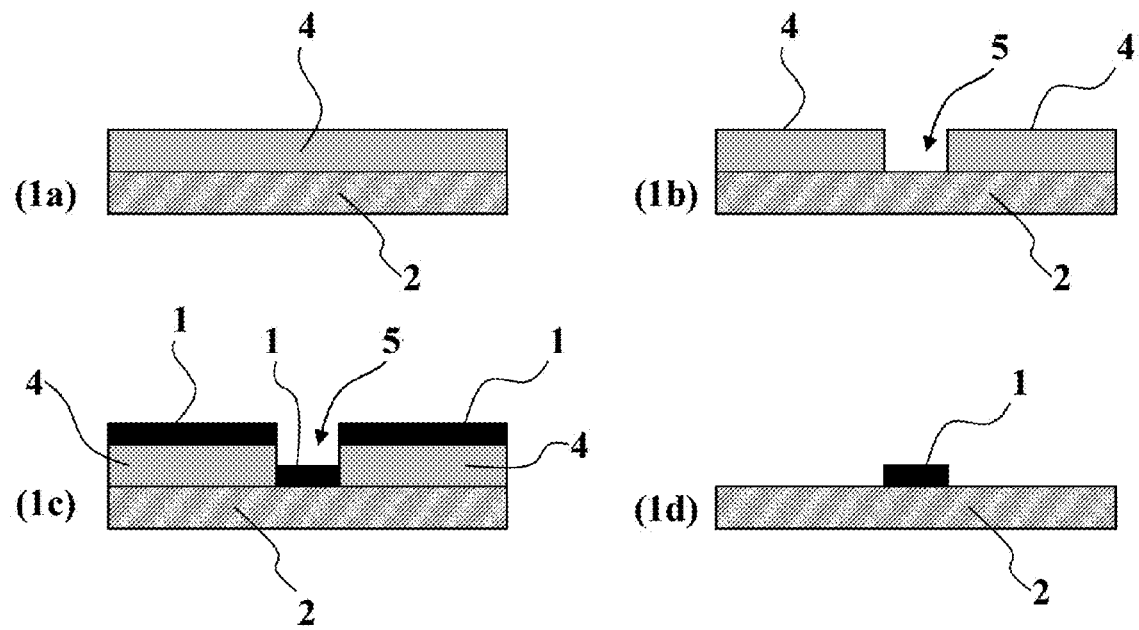
FIG. 3 is a simplified cross-section view of the different steps of the method of structuring an active layer of an electronic component by a lift-off method of prior art.
Figure 4A:
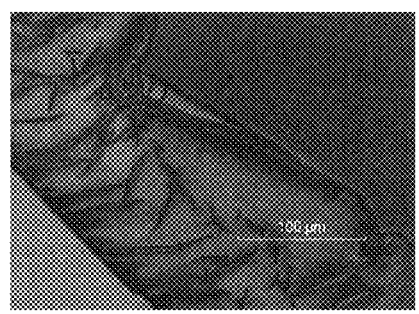
FIGS. 4A and 4B are optical microscope views of the defects of the surface of the active layer of an electronic component obtained with a structuring of the active layer by a lift-off method of prior art.
Figure 4B:
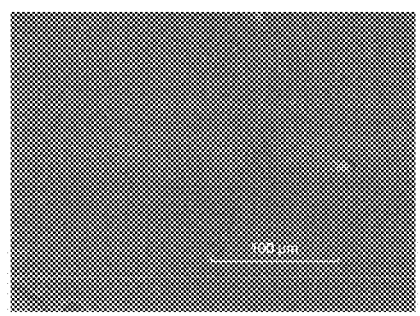

For clarity, in the following description, the same elements have been designated with the same reference numerals in the different drawings. Further, the various cross-section views are not necessarily drawn to scale.

In this specific embodiment, the etching of an active layer on a substrate to form OLED organic diodes will be described. However, it should be obvious that the method according to the invention may be used to form any type of organic electronic components, such as OTFT-type transistors, for example, without for all this departing from the framework of the invention.

Figure 5:
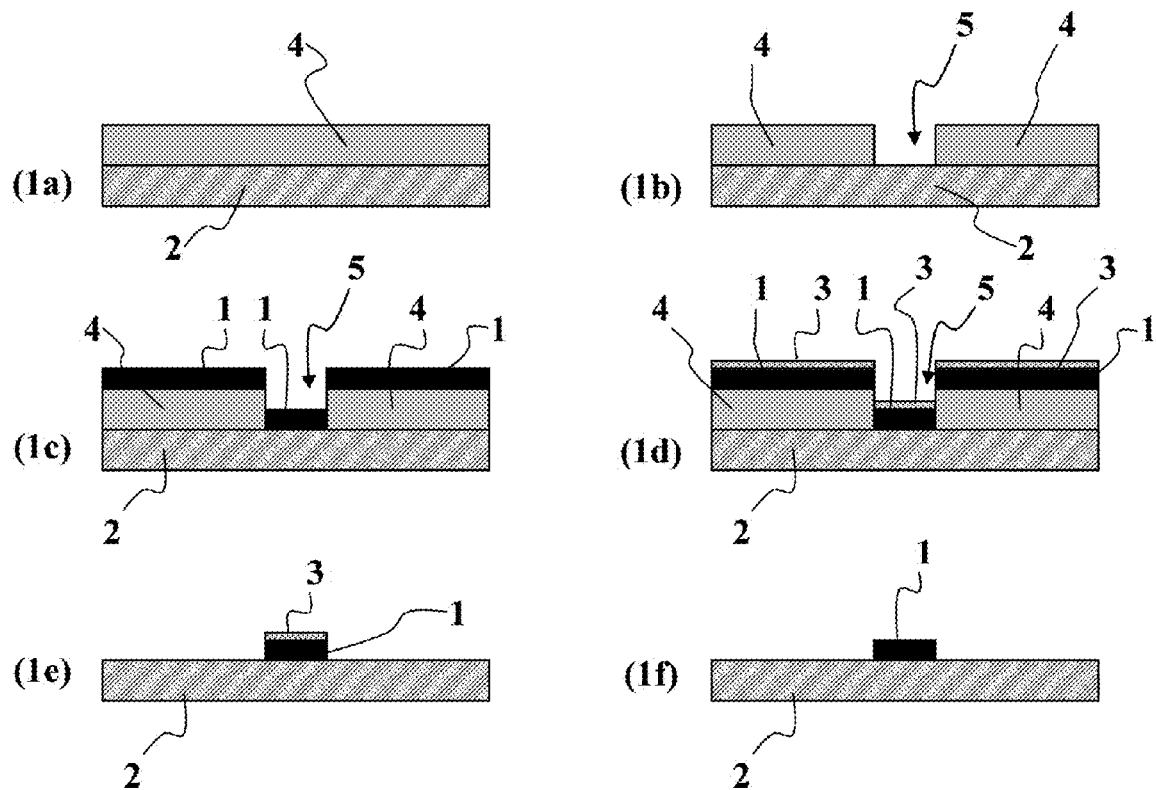
FIG. 5 is a simplified cross-section view of the different steps of the method of structuring an active layer of an electronic component according to the invention.

Referring to FIG. 5, the method of structuring an active organic layer deposited on a substrate according to the invention comprises a first step 1a of photolithographic deposition of a sacrificial resist layer 4 on a substrate 2.

Resist 4 is for example a positive resin, sold under reference Microposit® S1818® by Rohm and Haas Electronic Materials LLC. It has a thickness in the range from 1 to 4 micrometers.

Substrate 2 is for example made of glass, covered with ITO indium-tin oxide.

Substrate 2 may however be made of plastic material, for example, of polyethylene naphthalate (PEN) or of polyethylene terephthalate (PET), and have on its upper surface a thin layer of metal, such as gold (Au), silver (Ag), palladium (Pd), aluminum (Al), etc. . . . having a thickness in the range from 10 nanometers and 500 nanometers or a thin conductive polymer layer, such as a layer of poly(3,4-ethylenedioxythiophene) poly(styrenesulfonate) called PEDOT:PSS, having a thickness in the range from 50 to 2,000 nanometers or a thin inorganic conductor layer, such as indium-tin oxide (ITO) or gallium zinc oxide (GZO) for example, between 50 and 500 nanometers.

Further, resist S1818® used in this embodiment is a positive resin for which the UV radiation induces a chemical transformation of the macromolecules of the resin, causing an increased solubility of the exposed areas in the developer. The resist can thus be made of any positive resin, such as resin AZ® 9260 commercialized by AZ electronic materials GmbH, or the resin commercialized under reference Microposit® SJR 5740® by Rohm and Haas Electronic Materials, for example.

Sacrificial layer 4 may also be made of a negative resist, for which the ultraviolet radiation induces a polymerization of the exposed areas, thus giving these areas a specific resistance to the developing solvent, while the non-illuminated portions selectively disappear in the solvent. Such a negative resin is for example commercialized under reference SU-8 by MicroChem Corp.

Sacrificial layer 4 may finally be made of a reversible resin, which has the property of changing polarity during a reversion anneal step. Such a reversible resin is for example commercialized under reference AZ® 5214 by AZ electronic materials GmbH, or is the resin commercialized under reference T109XR®.

At a step 1b, at least one pattern 5, also called "diode pixel," is created. For this purpose, sacrificial resist layer 4 is annealed at a temperature in the range of 100 to 130° C. for 1 to 5 minutes, and preferably at a 115° C. temperature for 3 minutes. Then, the resist is illuminated, that is, exposed to ultraviolet rays (UV) through a mask comprising at least the pattern, the mask being not shown in FIG. 5. Finally, pattern 5 is developed by applying a developer to sacrificial resist layer 4 for approximately 45 seconds, the developer being for example commercialized under reference Microposit® MF319® by Rohm and Haas Electronic Materials.

After this step of creation of a pattern 5 in sacrificial resist layer 4, the method according to the invention comprises a step 1c of deposition of an active organic layer 1 on sacrificial layer 4 and in the pattern 5.

The step of depositing an active organic layer 1 comprises depositing a thickness in the range of 10 to 300 nanometers of a mixture of organic p- and n-type semiconductor molecules or polymers.

The mixture of organic p- and n-type semiconductor molecules or polymers is for example formed of a mixture of poly(3-hexyl-thiophene) (P3HT) and of 1-(3-methoxycarbonyl)propyl-1-phenyl-(6,6)C-61 (PCBM) in o-dichlorobenzene. It may also be made of a mixture of poly(3-octylthiophene-2,5-diyl)(P3OT) and of (6,6)-phenyl $C_{71}$ butyric acid ester ($PC_{71}BM$). It may further be made of any other appropriate mixture well known by those skilled in the art.

Active organic layer 1 may be deposited by spin coating or by any other method providing an appropriate homogeneous deposition such as, for example, a deposition by spreading, a silk-screen deposition, or a printing deposition.

Then, at a step 1d, a protective layer 3 made of organic polymer is deposited on active layer 1 and in pattern 5 of sacrificial resin layer 4.

This step of depositing a protective layer 3 comprises depositing by silk-screening by a thickness in the range from 100 to 5,000 nanometers at least one thermocrosslinkable perfluorinated aliphatic polymer such as a perfluorinated polymer commercialized under reference Cytop®. The obtained assembly is then annealed for from 2 to 10 minutes under a temperature in the range from 40 to 80° C., and for 6 minutes under a 60° C. temperature.

At a step 1e, sacrificial resist layer 4 is removed by projection of a solvent on the resin. The removal step comprises spraying a jet of solvent, such as acetone, for example, by any appropriate means, on sacrificial layer 4 for a time in the range from 5 to 60 seconds, and preferably for a time in the range from 10 to 30 seconds. This step of removing sacrificial layer 4 induces the simultaneous removal of active layer 1 and of protective layer 3, except for active layer 1 and protective layer 3 initially deposited in pattern 5.

It can be observed that protective layer 3 deposited in pattern 5 of sacrificial layer 4 covers active layer 1 deposited in the pattern 5 and protects it on removal of the sacrificial layer by projection of a solvent, thus avoiding any surface alteration of the active layer. Further, the mechanical effect of the solvent projection enables to decrease the duration of the contact of the solvent with the different layers of the component, the contact duration being in the order of 20 seconds, and accordingly enables to decrease risks of deterioration of active layer 1. The redeposition of particles on the active is also no longer necessary.

At a last step 1f, protective layer 3 is removed by dissolution of the polymer which forms it in a solvent, such as perfluorotributylamine (FC43). It should be noted that, on removal of protective layer 3, the solvent is only in contact with lateral walls of active layer 1, thus avoiding altering the upper surface of active layer 1.

Figure 6A:
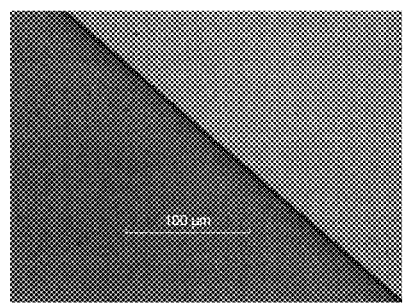
FIGS. 6A and 6B are optical microscope views of the defect-free surface of the active layer of an electronic component obtained according to the active layer structuring method according to the invention.
Figure 6B:
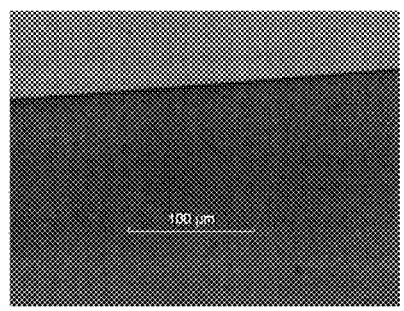

Thereby, as can be observed in FIGS. 6A and 6B, which are optical microscope views of the surface of active layer 1, and more specifically of the edge between the upper surface and a lateral wall of active layer 1 of an electronic component obtained according to the active layer structuring method according to the invention, the upper surface of the active layer 1 and the edges of the latter thus obtained have no defect.

The invention claimed is:

1. A method of structuring an active organic layer deposited on a substrate, said method comprising the steps of:
   depositing a sacrificial layer on the substrate by photolithography, the sacrificial layer being made of at least one resist comprising a resin;
   creating at least one opening inside of the sacrificial layer defining a pattern;
   depositing an active organic layer on the sacrificial layer and in the pattern;
   depositing a protective layer made of organic polymer on the active organic layer and in the pattern of the sacrificial layer;
   removing the sacrificial layer by projecting a solvent on the resin forming the layer; and
   then removing the protective layer by dissolving the polymer forming it in a solvent when the protective layer is disposed on the active organic layer, without removing the active organic layer.

2. The method of structuring an active organic layer of claim 1, wherein the step of creating patterns in the sacrificial layer comprises at least the steps of:
   annealing the sacrificial layer at a temperature in the range from 100 to 130° C. for from 1 to 5 minutes;
   exposing the sacrificial layer thus annealed to light through a mask comprising at least the pattern; and
   developing the pattern by sprinkling a developer on the sacrificial layer.

3. The method of structuring an active organic layer of claim 1, wherein the resist forming the sacrificial layer is made of a negative resin, and wherein ultraviolet radiation induces polymerization of the exposed areas.

4. The method of structuring an active organic layer of claim 1, wherein the resist forming the sacrificial layer is made of a positive resin, and wherein ultraviolet radiation induces a chemical transformation of macromolecules of the resin.

5. The method of structuring an active organic layer of claim 1, wherein the resist forming the sacrificial layer is made of a reversible resin having a property of changing polarity in a reversion annealing step.

6. The method of structuring an active organic layer of claim 1, wherein the step of removing the sacrificial layer comprises projecting a solvent on the sacrificial layer for a duration of time in a range of 5 to 60 seconds.

7. The method of structuring an active organic layer of claim 6, wherein the solvent is acetone.

8. The method of structuring an active organic layer of claim 1, wherein the step of depositing an active organic layer comprises depositing a mixture of organic p- and n-type semiconductor molecules or polymers by spin coating.

9. The method of structuring an active organic layer of claim 8, wherein the mixture of organic p- and n-type semiconductor molecules or polymers is a mixture of poly (3-hexyl-thiophene) (P3HT) and of 1-(3-methoxy-carbonyl) propyl-1-phenyl-(6,6)C-61 (PCBM) in o-dichlorobenzene.

10. The method of structuring an active organic layer of claim 8, wherein the mixture of organic p- and n-type semiconductor molecules or polymers is a mixture of poly (3-octylthiophene2,5-diyl)(P3OT) and of (6,6)-phenyl $C_{71}$ butyric acid ester ($PC_{71}BM$).

11. The method of structuring an active organic layer of claim 1, wherein the step of depositing a protective organic polymer layer on the active organic layer and in the pattern of the sacrificial layer comprises
   depositing at least one thermocrosslinkable perfluorinated aliphatic polymer on the active organic layer and in the pattern defined in the sacrificial layer by silk-screening; and
   annealing at a temperature in a range of 40 to 80° C. for a time of 2 to 10 minutes.

\* \* \* \* \*